(12) United States Patent
Kai et al.

(10) Patent No.: US 6,746,914 B2
(45) Date of Patent: Jun. 8, 2004

(54) METAL SANDWICH STRUCTURE FOR MIM CAPACITOR ONTO DUAL DAMASCENE

(75) Inventors: Shao Kai, Singapore (SG); Ng Hwei, Singapore (SG); Sanford Chu, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/140,644

(22) Filed: May 7, 2002

(65) Prior Publication Data
US 2003/0211731 A1 Nov. 13, 2003

(51) Int. Cl.[7] .......................................... H01L 21/8242
(52) U.S. Cl. .................... 438/253; 438/396; 257/306
(58) Field of Search .................... 438/396, 253, 438/618, 622, 633, 634, 637, 629; 257/306, 303, 532

(56) References Cited

U.S. PATENT DOCUMENTS

| | | | |
|---|---|---|---|
| 6,037,216 A | 3/2000 | Liu et al. | 438/253 |
| 6,117,747 A * | 9/2000 | Shao et al. | 438/396 |
| 6,124,199 A | 9/2000 | Gambino et al. | 438/622 |
| 6,130,102 A | 10/2000 | White, Jr. et al. | 438/3 |
| 6,143,601 A | 11/2000 | Sun | 438/253 |
| 6,166,423 A * | 12/2000 | Gambino et al. | 257/532 |
| 6,180,976 B1 | 1/2001 | Roy | 257/306 |
| 6,184,550 B1 | 2/2001 | Van Buskirk et al. | 257/306 |
| 6,222,219 B1 * | 4/2001 | Gambino et al. | 257/306 |
| 6,259,128 B1 * | 7/2001 | Adler et al. | 257/301 |
| 6,313,003 B1 * | 11/2001 | Chen | 438/396 |
| 6,410,386 B1 * | 6/2002 | Hsue et al. | 438/253 |
| 6,429,474 B1 * | 8/2002 | Gambino et al. | 257/296 |
| 6,452,251 B1 * | 9/2002 | Bernstein et al. | 257/532 |
| 6,466,427 B1 * | 10/2002 | Chen | 361/306.3 |
| 6,483,142 B1 * | 11/2002 | Hsue et al. | 257/306 |
| 6,492,226 B1 * | 12/2002 | Hsue et al. | 438/253 |
| 6,498,364 B1 * | 12/2002 | Downey et al. | 257/303 |
| 6,504,205 B1 * | 1/2003 | Hsue et al. | 257/306 |
| 6,512,260 B2 * | 1/2003 | Hsue et al. | 257/306 |
| 2002/0179950 A1 * | 12/2002 | Morimoto et al. | 257/306 |
| 2002/0192919 A1 * | 12/2002 | Bothra | 438/381 |
| 2003/0025143 A1 * | 2/2003 | Lin | 257/303 |
| 2003/0030084 A1 * | 2/2003 | Moise et al. | 257/295 |
| 2003/0064583 A1 * | 4/2003 | Kim et al. | 438/665 |

* cited by examiner

*Primary Examiner*—Long Pham
*Assistant Examiner*—Thao X. Le
(74) *Attorney, Agent, or Firm*—George O. Saile; Rosemary L. S. Pike

(57) ABSTRACT

A first and second damascene copper interconnect plug are created over the surface of a substrate. A MIM capacitor, which is aligned with the second damascene copper interconnect plug, is created by a one-time etch of a stack of layers comprising Ta/capacitor dielectric/Ta. Copper interconnects are then created aligned with the MIM capacitor and the second damascene interconnect plug.

53 Claims, 2 Drawing Sheets

METAL SANDWICH STRUCTURE FOR MIM CAPACITOR ONTO DUAL DAMASCENE

BACKGROUND OF THE INVENTION (1) Field of the Invention

The invention relates to the fabrication of integrated circuit devices, and more particularly, to a method of applying the damascene process as part of the creation of a MIM capacitor.

(2) Description of the Prior Art

The manufacturing of semiconductor devices frequently requires the creation of electrical components that collectively perform functions of data manipulation (logic functions) or functions of data retention (storage functions). Most semiconductor devices are devices that perform binary logic functions that are reflected by on or off-mode conditions of binary circuits. In addition, a number of applications use analog levels of voltages, the voltages having a range of values between a high limit and a low limit. Digital and analog methods of signal processing may reside side by side in the same semiconductor device or package.

It is therefore not uncommon to see a mixture of electrical components and functions, comprising semiconductor devices, resistors and capacitors. The majority of semiconductor components consists of transistors, gate electrodes and a variety of switching components for the performance of logic processing functions. Capacitors may form a basic component of analog circuits in for instance switched capacitor filters. Capacitors are further widely applied in digital applications such as the storage node for Dynamic Random Access Memory (DRAM) circuits.

A capacitor may be used as part of analog processing capabilities. In digital circuits, the capacitor is used to provide charge storage locations for individual bits of digital data that are stored in the digital Integrated Circuit (IC).

The conventional process of creating a capacitor in combination with the creation of a CMOS device is a relatively complex and therefore expensive process. This will further emphasize that the process of the invention, whereby a Metal-Insulator-Metal (MIM) capacitor is created that can be applied for mixed-mode applications, is a relatively simple and therefore cost effective method of creating a capacitor. The invention uses methods that are conventionally used to create damascene structures. The invention therefore incorporates damascene technology into the process of creating a MIM capacitor.

U.S. Pat. No. 6,143,601 (Sun) shows a MIM and dual damascene process.

U.S. Pat. No. 6,184,550 (Van Buskirk et al.) shows an N-C barrier layer for a MIM capacitor.

U.S. Pat. No. 6,180,976 (Roy) shows a MIM patterned but no SiN seal layer.

U.S. Pat. No. 6,130,102 (White, Jr. et al.), U.S. Pat. No. 6,124,199 (Gambino et al.), U.S. Pat. No. 6,117,747 (Shao et al.) and U.S. Pat. No. 6,037,216 (Liu et al.) are related patents.

SUMMARY OF THE INVENTION

A principle objective of the invention is to provide a manufacturable method of creating Metal-Insulator-Metal capacitors.

Another objective of the invention is to apply damascene processes to create Metal-Insulator-Metal capacitors.

In accordance with the objectives of the invention a new method is provided for the creation of a MIM capacitor. The invention starts with a semiconductor surface that is provided with semiconductor devices over the surface thereof. A first copper damascene process is applied for the creation of a first and a second damascene copper interconnect plug through a first layer of dielectric deposited over the surface of the substrate, the upper or trench portion of the dual damascene interconnects are copper wires in the surface of the first layer of dielectric. Deposited over the surface of the first layer of dielectric are a first layer of tantalum (for the formation of a bottom plate of a capacitor) over which is deposited a first layer of silicon nitride (for the formation of a capacitor dielectric) over which is deposited a second layer of tantalum (for the formation of a top plate of a capacitor). A one time etch of the three deposited layers forms a sandwich of three layers overlying the first plug, the patterned and etched three layers form a MIM capacitor. The etch stops at the surface of the first layer of dielectric and on the surface of the second dual damascene copper plug. A second layer of silicon nitride is deposited followed by the deposition of a second layer of dielectric. Third and fourth dual damascene openings are created through the second layer of dielectric and the second layer of silicon nitride. The third dual damascene opening aligns with MIM capacitor. The fourth dual damascene opening aligns with the second dual damascene plug. The dual damascene openings created through the second layer of dielectric are filled with copper, creating an access plug contacting the top plate of the capacitor and an access plug contacting the second dual damascene access plug.

DESCRIPTION OF THE PREFERRED EMBODIMENTS

Figure 1:
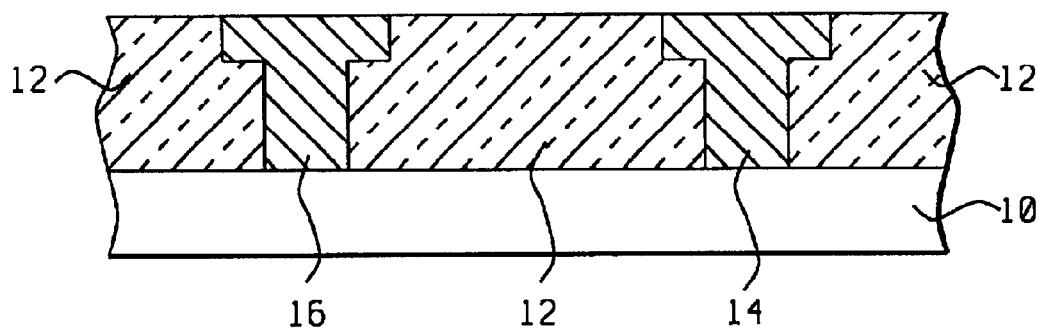
FIG. 1 shows a cross section of the surface of a substrate, a first layer of dielectric has been deposited over the surface of the substrate, a first and second copper dual damascene plug have been created through the first layer of dielectric.

Referring now specifically to the cross section that is shown in FIG. 1, there are shown the following elements:

10, the surface of a layer of semiconductor material, preferably the surface of a silicon substrate, semiconductor devices (not shown) have been created over the surface of substrate 10

12, a first layer of dielectric deposited over the surface of substrate 10

14, a first dual damascene plug created through the first layer 12 of dielectric, this first dual damascene plug is preferably filled with copper 16, a second dual damascene plug created through the first layer 12 of dielectric, this second dual damascene plug is preferably filled with copper.

In fabricating very and ultra large scale integration (VLSI and ULSI) circuits with the dual damascene process, an insulating or dielectric material, such as silicon oxide, of a semiconductor device is patterned with several thousand openings for the conductive lines and vias which are filled at the same time with metal and serve to interconnect the active and/or passive elements of the integrated circuit. The dual damascene process also is used for forming the multi-level conductive lines of metal, such as copper, in the insulating layers, such as polyimide, of multi-layer substrates on which semiconductor devices are mounted.

Damascene is an interconnection fabrication process in which grooves are formed in an insulating layer and filled with metal to form the conductive lines. Dual damascene is a multi-level interconnection process in which, in-addition to forming the grooves of single damascene, conductive via openings also are formed. In the standard dual damascene process, the insulating layer is coated with a photoresist which is exposed through a first mask with image pattern of the via openings and the pattern is anisotropically etched in the upper half of the insulating layer. The photoresist now is exposed through a second mask with an image pattern of the conductive line openings, after being aligned with the first mask pattern to encompass the via openings. In anisotropically etching the openings for the conductive lines in the upper half of the insulating material, the via openings already present in the upper half are simultaneously etched and replicated in the lower half of the insulating material. After the etching is complete, both the vias and line openings are filled with metal. Dual damascene is an improvement over single damascene because it permits the filling of both the conductive grooves and vias with metal at the same time, thereby eliminating process steps.

The layer 12 of dielectric is typically formed using silicon dioxide but is not limited to this material and can also comprise other typically applied dielectrics such as silicon nitride ("nitride"), tetra-ethyl-ortho-silicate (TEOS) based oxides, boro-phosphate-silicate-glass (BPSG), phospho-silicate-glass (PSG), boro-silicate-glass (BSG), oxide-nitride-oxide (ONO), tantalum pentoxide ($Ta_2O_5$), plasma enhanced silicon nitride (PSiNx), titanium oxide, oxynitride, a low dielectric constant material, such as hydrogen silsesquioxane, and HDP-FSG (high-density-plasma fluorine-doped silicide glass), which is a dielectric that has a lower dielectric constant than regular oxide. Some of the dielectrics can be grown on the surface of the substrate or can be physically deposited by for instance a sputtering process or by other chemical methods of dielectric deposition.

The most commonly used and therefore the preferred dielectrics of the invention for the deposition of layer 12 are silicon dioxide (doped or undoped), silicon oxynitride, parylene or polyimide, spin-on-glass, plasma oxide or LPCVD oxide.

For the creation of dual damascene plugs 14 and 16 the invention preferably uses copper for the filling of the plugs. It is preferred that the surface of layer 12 of dielectric is polished, preferably using methods of CMP, after the metal fill for the creation of dual damascene plugs 14 and 16 has been deposited over the surface of layer 12. This to assure good planarity for subsequent deposition processes.

Figure 2:
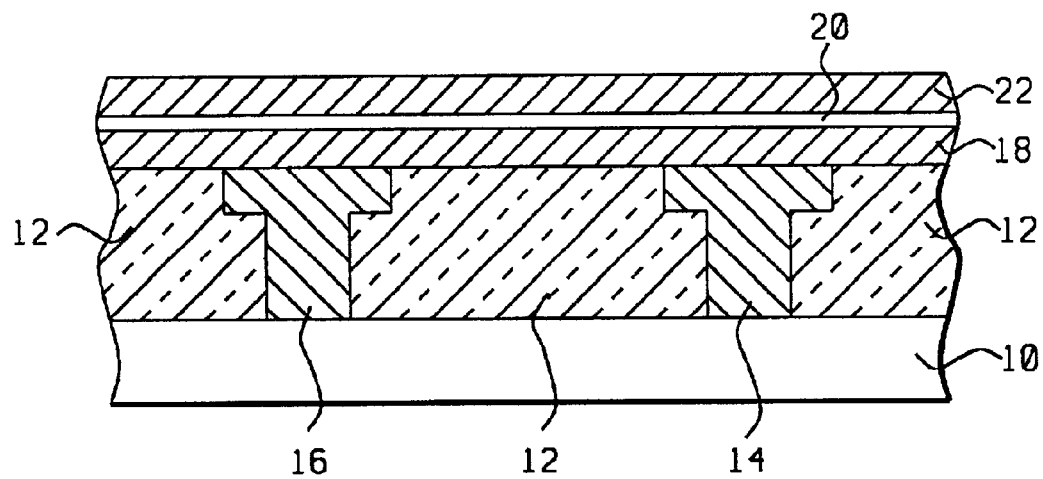
FIG. 2 shows a cross section after successive deposition of a first layer of tantalum (Ta) over which is deposited a first layer of silicon nitride over which is deposited a second layer of tantalum (Ta).

The invention proceeds with the cross section that is shown in FIG. 2, in which additionally are highlighted the following elements:

18, a first layer of MIM electrode material, preferably comprising tantalum (Ta), deposited over the surface of the first layer 12 of dielectric 20, a layer of capacitor dielectric, preferably comprising a first layer of silicon nitride, deposited over the surface of the first layer 18 of tantalum 22, a second layer of MIM electrode material, preferably comprising tantalum (Ta), deposited over the surface of layer 20 of capacitor dielectric.

Layers 18, 20 and 22 form a stack of three layers whereby, after patterning and etching, layer 18 will form a bottom plate or electrode of a MIM capacitor, layer 20 will form a capacitor dielectric and layer 22 will form a top plate of a MIM capacitor. For layers 18 and 22 may therefore be used any suitable material that can be applied for the creation of top and bottom plates of a Metal-Insulation-Metal capacitor, tantalum (Ta) has been cited above as one example of such a material.

Materials that may be considered for the creation of a bottom and a top plate of a MIM capacitor are aluminum (Al), titanium (Ti), titanium nitride (TiN), tantalum (Ta), tantalum nitride (TaN), tungsten (W), tungsten nitride (WN), molybdenum nitride (MoN), copper (Cu) and the like. Other materials that can be used as a capacitor electrode material include platinum (Pt), palladium (Pd), osmium (Os), ruthenium (Ru), iridium oxide ($IrO_2$), ruthenium oxide ($ReO_2$), $ReO_3$) and the like. In addition, combinations of the foregoing materials can be used as MIM capacitor electrode material.

Layer 20 of capacitor dielectric preferably comprises silicon nitride but can be selected from a group of capacitor dielectrics such as oxide-nitride-oxide (ONO), $Si_2O$, $Si_3N_4$ and other high dielectric constant material such as tantalum pentoxide ($TaO_5$).

Figure 3:
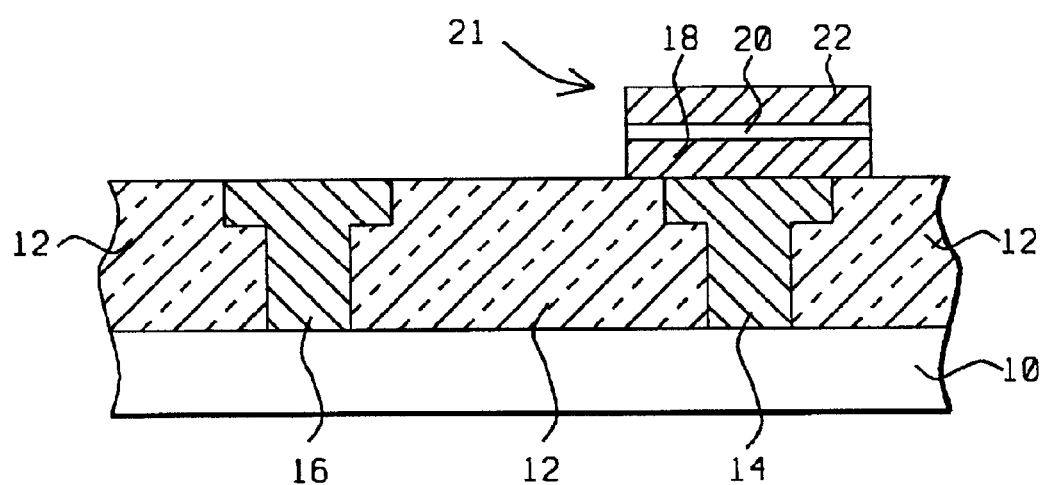
FIG. 3 shows a cross section after the three deposited layers have been etched, creating a capacitor aligned with the first dual damascene plug.

FIG. 3 shows a cross section of the substrate after the three layers 18, 20 and 22 have been patterned and etched, using conventional methods of photolithographic exposure and patterning. The layers 18, 20 and 22 have been removed from above the surface of layer 12 of first dielectric with the exception of the stack of layer 18, 20 and 22 overlying the first copper dual damascene contact plug 14. The remaining stack of layer layers 18, 20 and 22, as shown in the cross section of FIG. 3, form a MIM capacitor 21.

From the cross section that is shown in FIG. 3 it must be noted that:

The layers 18, 20 and 22 have been etched by applying a one-time etch of these layers The stack of patterned and etched layer 18, 20 and 22 is aligned with the first dual damascene copper plug 14

Layers 18, 20 and 22 are removed from above the second dual damascene copper plug 16, exposing the surface thereof, and The one-time etch of layers 18, 20 and 22 stops on the surface of the first layer 12 of dielectric.

Figure 4:
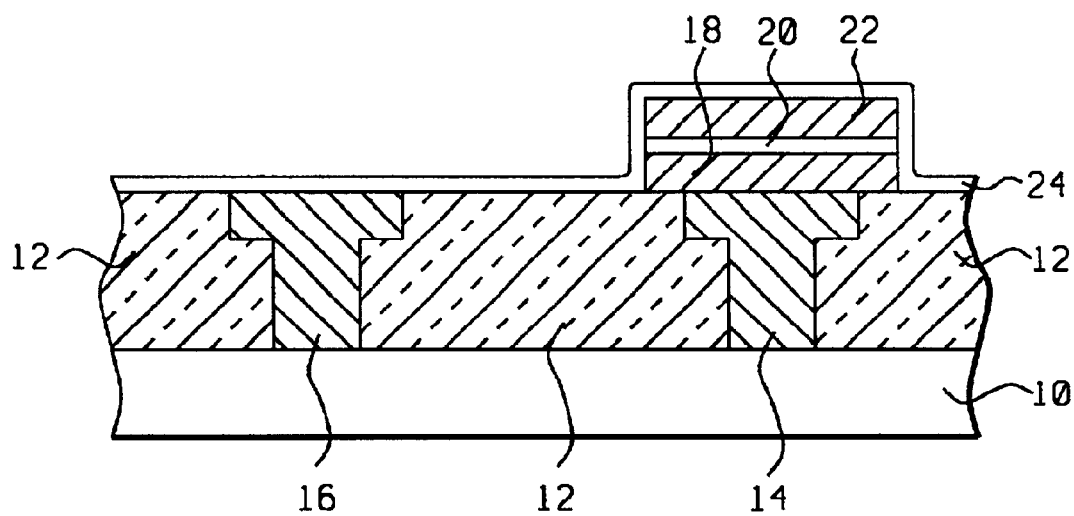
FIG. 4 shows a cross section after the deposition of a second layer of silicon nitride.

The invention proceeds, FIG. 4, with the deposition of a second layer 24 of silicon nitride over the exposed surface of first layer 12 of dielectric and the exposed surfaces of the MIM capacitor 21. This layer 24 essentially serves as an etch stop layer and, although silicon nitride has been cited as the preferred material to be used for this layer, the layer may be deposited using a material that comprises a silicon component, for instance dielectrics such as silicon dioxide ("oxide", doped or undoped) or silicon nitride ("nitride"), silicon oxynitride, silicon carbide (SiC), silicon oxycarbide (SiOC) and silicon nitro carbide (SiNC).

Layer 24, preferably comprising silicon nitride, can be deposited using LPCVD or PECVD procedures, at a temperature between about 200 and 800 degrees C., to a thickness between about 200 and 5,000 Angstrom.

Figure 5:
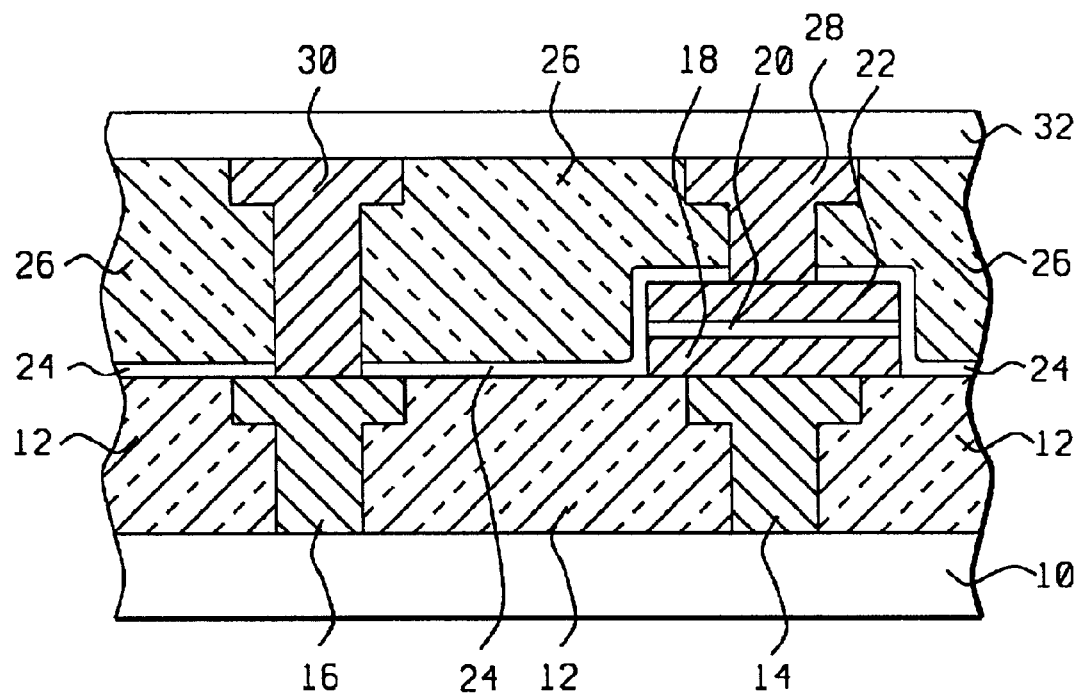
FIG. 5 shows a cross section after dual damascene plugs have been created aligned with the second dual damascene plug and the created capacitor.

The cross section of FIG. 5 shows how the invention now completes the structure, using the dual damascene process and structures, providing access to the created MIM capacitor 21 and the second copper dual damascene plug 16. A second layer 26 of dielectric is deposited over the surface of the deposited second layer 24 of silicon nitride. Dual damascene openings are created through layer 26 of dielectric and layer 24 of etch stop material for plugs 28 and 30 after which these openings are filled with copper. The surface of the second layer 26 of dielectric is polished, using methods of Chemical Mechanical Polishing, after the copper filling for plugs 28 and 30 has been deposited, removing excess copper from the surface of layer 26 and providing good planarity to this surface. As a final step, the layer 32 of passivation material is deposited over the surface of layer 26, thereby including the polished surface of plugs 28 and 30, for protection of the created structure against potentially damaging effects of further handling or exposure to moisture, chemicals, metal and the like.

The invention can be summarized as follows:

A substrate is provided, semiconductor devices have been created in or over the surface of the substrate A first and a second conductive plug are formed, using dual damascene procedures, through a first layer of dielectric deposited over the surface of the substrate A stack of three layers is created over the surface of the first layer of dielectric, comprising a first layer of MIM electrode material, over which a second layer of MIM dielectric material over which a third layer of MIM electrode material The stack of three layers is etched, applying a one-step etch, leaving these three layers in place in a pattern overlying the first interconnect plug and forming a MIM capacitor thereover A layer of etch stop material is deposited A second layer of dielectric material is deposited A third and a fourth conductive plug are formed, using dual damascene, through the second layer of dielectric, the third conductive plug being aligned with the MIM capacitor, the fourth conductive plug being aligned with the second conductive plug The surface of the second layer of dielectric polished, using methods of CMP, the remove excess metal from the surface thereof A layer of passivation is deposited over the surface of the second layer of dielectric, and All conductive plugs preferably use copper as an interconnect medium.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of forming conductive interconnect plugs and interconnect plugs to a Metal-Insulator-Metal capacitor by applying the dual damascene process, comprising the steps of:

providing a substrate, said substrate having been provided with semiconductor devices in or over the surface thereof;

providing at least one first and at least one second dual damascene plug through a first layer of dielectric deposited over the surface of said substrate;

creating at least one Metal-Insulator-Metal capacitor over the surface of said first layer of dielectric aligned with said at least one first dual damascene plug, said creating at least one Metal-Insulator-Metal capacitor comprising a one step etch of a stack of layers comprising a first layer of capacitor electrode material over which a layer of capacitor dielectric material over which a second layer of capacitor electrode material wherein said a first layer of capacitor electrode is in contact with said first layer of dielectric;

providing at least one third and at least one fourth dual damascene plug through:
  (i) a layer of etch stop material deposited over the surface of said first layer of dielectric, and
  (ii) a second layer of dielectric deposited over the surface of said layer of etch stop material, said at least one third dual damascene plug being aligned with said at least one Metal-Insulator-Metal capacitor, said at least one fourth dual damascene interconnect plug being aligned with said at least one second dual damascene plug.

2. The method of claim 1, additionally depositing a layer of passivation over the surface of said second layer of dielectric.

3. The method of claim 1, said at least one first dual damascene plug comprising copper.

4. The method of claim 1, said at least one second dual damascene plug comprising copper.

5. The method of claim 1, said at least one third dual damascene plug comprising copper.

6. The method of claim 1, said at least one fourth dual damascene plug comprising copper.

7. The method of claim 1, said creating at least one Metal-Insulator-Metal capacitor over the surface of said first layer of dielectric aligned with said at least one first dual damascene plug comprising the steps of:

depositing a first layer of capacitor electrode material over the surface of said first layer of dielectric; then depositing a layer of capacitor dielectric material over the surface of said first layer of capacitor electrode material; then depositing a second layer of capacitor electrode material over the surface of said layer of capacitor dielectric material; and then patterning and etching by applying a one-step etch said second layer of capacitor electrode material, said layer of capacitor dielectric material and said first layer of capacitor electrode material.

8. The method of claim 1, said layer of etch stop material comprising silicon nitride.

9. The method of claim 7, said first layer of capacitor electrode material comprising tantalum.

10. The method of claim 7, said a layer of capacitor dielectric material comprising silicon nitride.

11. The method of claim 7, said second layer of capacitor electrode material comprising tantalum.

12. A method of forming conductive interconnect plugs and interconnect plugs to a Metal-Insulator-Metal capacitor by applying the dual damascene process, comprising the steps of:

providing a substrate, said substrate having been provided with semiconductor devices in or over the surface thereof;

providing a first level of dual damascene interconnect plugs through a first layer of dielectric deposited over the surface of said substrate, said first level of dual damascene interconnect plugs comprising at least one first and at least one second dual damascene interconnect plug;

creating at least one Metal-Insulator-Metal capacitor over the surface of said first layer of dielectric aligned with said at least one first dual damascene interconnect plug, said creating at least one Metal-Insulator-Metal capacitor comprising a one step etch of a stack of layers comprising a first layer of capacitor electrode material over which a layer of capacitor dielectric material over which a second layer of capacitor electrode material wherein said a first layer of capacitor electrode is in contact with said first layer of dielectric;

depositing a layer of etch stop material over the surface of said first layer of dielectric, thereby including exposed surfaces of said at least one Metal-Insulator-Metal capacitor;

providing a second level of dual damascene interconnect plugs through a second layer of dielectric deposited over the surface of said first layer of dielectric and through said layer of etch stop material, said second level of dual damascene interconnect plugs comprising at least one third and at least one fourth dual damascene interconnect plug, said at least one third dual damascene interconnect plug being aligned with said at least one Metal-Insulator-Metal capacitor, said at least one fourth dual damascene interconnect plug being aligned with said at least one second dual damascene interconnect plug; and depositing a layer of passivation material over the surface of said second layer of dielectric.

13. The method of claim 12, said first level of dual damascene interconnect plugs comprising copper.

14. The method of claim 12, said second level of dual damascene interconnect plugs comprising copper.

15. The method of claim 12, said creating at least one Metal-Insulator-Metal capacitor over the surface of said first layer of dielectric aligned with said at least one first dual damascene interconnect plug comprising the steps of:

depositing a first layer of capacitor electrode material over the surface of said first layer of dielectric; then depositing a layer of capacitor dielectric material over the surface of said first layer of capacitor electrode material; then depositing a second layer of capacitor electrode material over the surface of said layer of capacitor dielectric material; and then patterning and etching by applying a one-step etch said second layer of capacitor electrode material, said layer of capacitor dielectric material and said first layer of capacitor electrode material.

16. The method of claim 12, said layer of etch stop material comprising silicon nitride.

17. The method of claim 12, said first layer of capacitor electrode material comprising tantalum.

18. The method of claim 12, said a layer of capacitor dielectric material comprising silicon nitride.

19. The method of claim 12, said second layer of capacitor electrode material comprising tantalum.

20. A method of forming conductive interconnect plugs and interconnect plugs to a Metal-Insulator-Metal capacitor by applying the dual damascene process, comprising the steps of:

providing a substrate, said substrate having been provided with semiconductor devices in or over the surface thereof;

depositing a first layer of dielectric over the surface of said substrate;

patterning and etching said first layer of dielectric, creating at least one first dual damascene opening and at least one second dual damascene opening through said first layer of dielectric;

filling said at least one first and said at least one second dual damascene opening with a metal, creating at least one first and at least one second dual damascene plug;

creating at least one Metal-Insulator-Metal capacitor over the surface of said first layer of dielectric, said at least one Metal-Insulator-Metal capacitor being aligned with said least one first dual damascene opening, said creating at least one Metal-Insulator-Metal capacitor comprising a one step etch of a stack of layers comprising a first layer of capacitor electrode material over which a layer of capacitor dielectric material over which a second layer of capacitor electrode material wherein said a first layer of capacitor electrode is in contact with said first layer of dielectric;

depositing a layer of etch stop material over the surface of said first layer of dielectric, thereby including exposed surfaces of said at least one Metal-Insulator-Metal capacitor;

depositing a second layer of dielectric over the surface of said layer of etch stop material;

patterning and etching said second layer of dielectric, creating at least one third dual damascene opening and at least one fourth dual damascene opening through said second layer of dielectric and said layer of etch stop material, said at least one third opening being aligned with said at least one Metal-Insulator-Metal capacitor, said at least one fourth opening being aligned with said at least one second opening created through said first layer of dielectric; and filling said at least one third and said at least one fourth dual damascene opening with a metal, creating at least one third and at least one fourth dual damascene plug.

21. The method of claim 20, additionally applying a first step of planarization of the surface of the deposited first layer of dielectric, using methods of Chemical Mechanical Polishing, said first additional step being applied after said step of filling said at least one first and said at least one second dual damascene opening with a metal.

22. The method of claim 20, additionally applying a second step of planarization of the surface of the deposited second layer of dielectric, using methods of Chemical Mechanical Polishing, said first additional step being applied after said steps of filling said at least one third and said at least one fourth dual damascene opening with a metal.

23. The method of claim 22, additionally depositing a layer of passivation over the planarized surface of said second layer of dielectric.

24. The method of claim 20, said at least one first dual damascene interconnect plug comprising copper.

25. The method of claim 20, said at least one second dual damascene interconnect plugs comprising copper.

26. The method of claim 20, said at least one third dual damascene interconnect plug comprising copper.

27. The method of claim 20, said at least one fourth dual damascene interconnect plugs comprising copper.

28. The method of claim 20, said creating at least one Metal-Insulator-Metal capacitor over the surface of said first layer of dielectric aligned with said at least one first dual damascene interconnect plug comprising the steps of:

depositing a first layer of capacitor electrode material over the surface of said first layer of dielectric; then depositing a layer of capacitor dielectric material over the surface of said first layer of capacitor electrode material; then depositing a second layer of capacitor electrode material over the surface of said layer of capacitor dielectric material; and then patterning and etching by applying a one-step etch said second layer of capacitor electrode material, said layer of capacitor dielectric material and said first layer of capacitor electrode material.

29. The method of claim 20, said layer of etch stop material comprising silicon nitride.

30. The method of claim 28, said first layer of capacitor electrode material comprising tantalum.

31. The method of claim 28, said a layer of capacitor dielectric material comprising silicon nitride.

32. The method of claim 28, said second layer of capacitor electrode material comprising tantalum.

33. A method of forming conductive interconnect plugs and interconnect plugs to a Metal-Insulator-Metal capacitor by applying the dual damascene process, comprising the steps of:

providing a substrate, said substrate having been provided with semiconductor devices in or over the surface thereof;

depositing a first layer of dielectric over the surface of said substrate;

patterning and etching said first layer of dielectric, creating at least one first dual damascene opening and at least one second dual damascene opening through said first layer of dielectric;

filling said at least one first and said at least one second dual damascene opening with copper, creating at least one first and at least one second copper dual damascene plug;

creating at least one Metal-Insulator-Metal capacitor over the surface of said first layer of dielectric, said at least one Metal-Insulator-Metal capacitor being aligned with said least one first dual damascene opening, said creating at least one Metal-Insulator-Metal capacitor comprising a one step etch of a stack of layers comprising a first layer of capacitor electrode material over which a layer of capacitor dielectric material over which a second layer of capacitor electrode material wherein said a first layer of capacitor electrode is in contact with said first layer of dielectric;

depositing a layer of etch stop material over the surface of said first layer of dielectric, thereby including exposed surfaces of said at least one Metal-Insulator-Metal capacitor;

depositing a second layer of dielectric over the surface of said layer of etch stop material;

patterning and etching said second layer of dielectric, creating at least one third dual damascene opening and at least one fourth dual damascene opening through said second layer of dielectric and said layer of etch stop material, said at least one third opening being aligned with said at least one Metal-Insulator-Metal capacitor, said at least one fourth opening being aligned with said at least one second opening created through said first layer of dielectric; and filling said at least one third and said at least one fourth dual damascene opening with copper, creating at least one third and at least one fourth copper dual damascene plug.

34. The method of claim 33, additionally applying a first step of planarization of the surface of the deposited first layer of dielectric, using methods of Chemical Mechanical Polishing, said first additional step being applied after said step of filling said at least one first and said at least one second dual damascene opening with copper.

35. The method of claim 33, additionally applying a second step of planarization of the surface of the deposited second layer of dielectric, using methods of Chemical Mechanical Polishing, said first additional step being applied after said steps of filling said at least one third and said at least one fourth dual damascene opening with copper.

36. The method of claim 35, additionally depositing a layer of passivation over the planarized surface of said second layer of dielectric.

37. The method of claim 33, said creating at least one Metal-Insulator-Metal capacitor over the surface of said first layer of dielectric aligned with said at least one first dual damascene interconnect plug comprising the steps of:

depositing a first layer of capacitor electrode material over the surface of said first layer of dielectric; then depositing a layer of capacitor dielectric material over the surface of said first layer of capacitor electrode material; then depositing a second layer of capacitor electrode material over the surface of said layer of capacitor dielectric material; and then patterning and etching by applying a one-step etch said second layer of capacitor electrode material, said layer of capacitor dielectric material and said first layer of capacitor electrode material.

38. The method of claim 33, said layer of etch stop material comprising silicon nitride.

39. The method of claim 37, said first layer of capacitor electrode material comprising tantalum.

40. The method of claim 37, said a layer of capacitor dielectric material comprising silicon nitride.

41. The method of claim 37, said second layer of capacitor electrode material comprising tantalum.

42. A method of forming conductive interconnect plugs and interconnect plugs to a Metal-Insulator-Metal capacitor by applying the dual damascene process, comprising the steps of:

providing a substrate, said substrate having been provided with semiconductor devices in or over the surface thereof;

depositing a first layer of dielectric over the surface of said substrate;

patterning and etching said first layer of dielectric, creating at least one first dual damascene opening and at least one second dual damascene opening through said first layer of dielectric;

filling said at least one first and said at least one second dual damascene opening with copper, creating at least one first and at least one second copper dual damascene plug;

creating at least one Metal-Insulator-Metal capacitor over the surface of said first layer of dielectric, said at least one Metal-Insulator-Metal capacitor being aligned with said least one first dual damascene opening, said creating at least one Metal-Insulator-Metal capacitor comprising the steps of:

(i) depositing a first layer of capacitor electrode material over the surface of said first layer of dielectric wherein said a first layer of capacitor electrode is in contact with said first layer of dielectric; then (ii) depositing a layer of capacitor dielectric material over the surface of said first layer of capacitor electrode material; then (iii) depositing a second layer of capacitor electrode material over the surface of said layer of capacitor dielectric material; and then (iv) patterning and etching by applying a one-step etch said second layer of capacitor electrode material, said layer of capacitor dielectric material and said first layer of capacitor electrode material;

depositing a layer of etch stop material over the surface of said first layer of dielectric, thereby including exposed surfaces of said at least one Metal-Insulator-Metal capacitor;

depositing a second layer of dielectric over the surface of said layer of etch stop material;

patterning and etching said second layer of dielectric, creating at least one third dual damascene opening and at least one fourth dual damascene opening through said second layer of dielectric and said layer of etch stop material, said at least one third opening being aligned with said at least one Metal-Insulator-Metal capacitor, said at least one fourth opening being aligned with said at least one second opening created through said first layer of dielectric; and filling said at least one third and said at least one fourth dual damascene opening with copper, creating at least one third and at least one fourth copper dual damascene plug.

43. The method of claim 42, additionally applying a first step of planarization of the surface of the deposited first layer of dielectric, using methods of Chemical Mechanical Polishing, said first additional step being applied after said step of filling said at least one first and said at least one second dual damascene opening with copper.

44. The method of claim 42, additionally applying a second step of planarization of the surface of the deposited second layer of dielectric, using methods of Chemical Mechanical Polishing, said first additional step being applied after said steps of filling said at least one third and said at least one fourth dual damascene opening with copper.

45. The method of claim 44, additionally depositing a layer of passivation over the planarized surface of said second layer of dielectric.

46. The method of claim 42, said layer of etch stop material comprising silicon nitride.

47. The method of claim 42, said first layer of capacitor electrode material comprising tantalum.

48. The method of claim 42, said a layer of capacitor dielectric material comprising silicon nitride.

49. The method of claim 42, said second layer of capacitor electrode material comprising tantalum.

50. A method of forming conductive interconnect plugs and interconnect plugs to a Metal-Insulator-Metal capacitor by applying the dual damascene process, comprising the steps of:

providing a substrate, said substrate having been provided with semiconductor devices in or over the surface thereof;

depositing a first layer of dielectric over the surface of said substrate;

patterning and etching said first layer of dielectric, creating at least one first dual damascene opening and at least one second dual damascene opening through said first layer of dielectric;

filling said at least one first and said at least one second dual damascene opening with copper, creating at least one first and at least one second copper dual damascene plug;

creating at least one Metal-Insulator-Metal capacitor over the surface of said first layer of dielectric, said at least one Metal-Insulator-Metal capacitor being aligned with said least one first dual damascene opening, said creating at least one Metal-Insulator-Metal capacitor comprising the steps of:

(i) depositing a first layer tantalum over the surface of said first layer of dielectric wherein said a first layer of tantalum is in contact with said first layer of dielectric; then (ii) depositing a first layer of silicon nitride over the surface of said first layer of capacitor electrode material; then (iii) depositing a second layer of tantalum over the surface of said layer of capacitor dielectric material; and then (iv) patterning and etching by applying a one-step etch said second layer of tantalum, said first layer of silicon nitride and said first layer of tantalum;

depositing a second layer of silicon nitride over the surface of said first layer of dielectric, thereby including exposed surfaces of said at least one Metal-Insulator-Metal capacitor;

depositing a second layer of dielectric over the surface of said layer of etch stop material;

patterning and etching said second layer of dielectric, creating at least one third dual damascene opening and at least one fourth dual damascene opening through said second layer of dielectric and said second layer of silicon nitride, said at least one third opening being aligned with said at least one Metal-Insulator-Metal capacitor, said at least one fourth opening being aligned with said at least one second opening created through said first layer of dielectric; and filling said at least one third and said at least one fourth dual damascene opening with copper, creating at least one third and at least one fourth copper dual damascene plug.

51. The method of claim 50, additionally applying a first step of planarization of the surface of the deposited first layer of dielectric, using methods of Chemical Mechanical Polishing, said first additional step being applied after said step of filling said at least one first and said at least one second dual damascene opening with a copper.

52. The method of claim 51, additionally applying a second step of planarization of the surface of the deposited second layer of dielectric, using methods of Chemical Mechanical Polishing, said first additional step being applied after said steps of filling said at least one third and said at least one fourth dual damascene opening with copper.

53. The method of claim 52, additionally depositing a layer of passivation over the planarized surface of said second layer of dielectric.

* * * * *